(12) United States Patent
Huh et al.

(10) Patent No.: US 10,748,892 B2
(45) Date of Patent: Aug. 18, 2020

(54) DISPLAY APPARATUS

(71) Applicant: SAMSUNG DISPLAY CO., LTD., Yongin-si, Gyeonggi-do (KR)

(72) Inventors: Jongmoo Huh, Yongin-si (KR); Dongwon Kim, Yongin-si (KR); Shinhyuk Yang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/124,519

(22) Filed: Sep. 7, 2018

(65) Prior Publication Data
US 2019/0074276 A1    Mar. 7, 2019

(30) Foreign Application Priority Data
Sep. 7, 2017  (KR) .................. 10-2017-0114702

(51) Int. Cl.
| | |
|---|---|
| *H01L 27/02* | (2006.01) |
| *H01L 27/32* | (2006.01) |
| *H01L 51/52* | (2006.01) |
| *H01L 27/12* | (2006.01) |
| *H01L 51/00* | (2006.01) |

(52) U.S. Cl.
CPC ...... *H01L 27/0296* (2013.01); *H01L 27/1218* (2013.01); *H01L 27/323* (2013.01); *H01L 27/3262* (2013.01); *H01L 51/5237* (2013.01); *H01L 27/3244* (2013.01); *H01L 51/0097* (2013.01); *H01L 51/5256* (2013.01); *H01L 2251/5338* (2013.01)

(58) Field of Classification Search
CPC ............. H01L 27/0296; H01L 27/3262; H01L 27/323; H01L 51/5256; H01L 51/0097; H01L 2251/5338; H01L 51/5237; H01L 27/1218; H01L 27/3244
See application file for complete search history.

(56) References Cited

U.S. PATENT DOCUMENTS

| | | | |
|---|---|---|---|
| 9,397,316 B2 | 7/2016 | Odaka et al. | |
| 9,627,636 B2 | 4/2017 | Heo et al. | |
| 2015/0123098 A1* | 5/2015 | Kang | ................. H01L 51/5253 257/40 |
| 2017/0092709 A1 | 3/2017 | Choi et al. | |
| 2017/0110687 A1 | 4/2017 | Kim et al. | |

FOREIGN PATENT DOCUMENTS

| | | |
|---|---|---|
| JP | 2014-107242 | 6/2014 |
| KR | 10-2016-0076005 | 6/2016 |
| KR | 10-2017-0037786 | 4/2017 |
| KR | 10-2017-0045783 | 4/2017 |

* cited by examiner

*Primary Examiner* — Karen Kusumakar
(74) *Attorney, Agent, or Firm* — F. Chau & Associates, LLC

(57) ABSTRACT

A display apparatus that can reduce defects caused by static electricity, includes a substrate unit that includes at least one organic insulating layer, at least one inorganic insulating layer, and a first conductive layer that includes doped amorphous silicon (a-Si) that is disposed between the at least one organic insulating layer and the at least one inorganic insulating layer; and a thin film transistor unit disposed on the substrate portion and that includes a thin film transistor.

21 Claims, 7 Drawing Sheets

DISPLAY APPARATUS

CROSS-REFERENCE TO RELATED APPLICATION

This application claims priority under 35 U.S.C. § 119 from, and the benefit of, Korean Patent Application No, 10-2017-0114702, filed on Sep. 7, 2017 in the Korean Intellectual Property Office, the contents of which are herein incorporated by reference in their entirety.

BACKGROUND

1. Technical Field

One or more embodiments are directed to a display apparatus, and more particularly, to a display apparatus that can reduce defects caused by static electricity.

2. Discussion of the Related Art

In general, a display apparatus is manufactured by attaching a thin film transistor on a rigid or flexible substrate and incorporating a display device electrically connected to the thin film transistor. Such a display apparatus can be used as a display unit in a small-sized product such as a mobile phone, or a display unit in a large-sized product such as a television.

In a conventional display apparatus, when a rigid or flexible substrate physically contacts an external object, charging occurs, and devices that include a thin film transistor can be damaged due to static electricity. In particular, in a case of a flexible display apparatus that includes a flexible substrate, since the flexible substrate includes an organic material, it can induce static electricity in other devices through the flexible substrate, and when the flexible substrate is repeatedly folded/unfolded, electric charges concentrate on a bending portion, which can damage components at the corresponding portion.

SUMMARY

One or more embodiments include a display apparatus that can reduce defects caused by static electricity.

Additional features will be set forth in part in the description which follows and, in part, will be apparent from the description, or may be learned by practice of the presented embodiments.

According to one or more embodiments, a display apparatus includes: a substrate portion that includes at least one organic insulating layer, at least one inorganic insulating layer, and a first conductive layer that includes amorphous silicon (a-Si) and that is disposed between the at least one organic insulating layer and the at least one inorganic insulating layer; and a thin film transistor portion disposed on the substrate portion and that includes a thin film transistor.

The first conductive layer may be doped. The substrate portion may include a first organic insulating layer, a first inorganic insulating layer on the first organic insulating layer, a second organic insulating layer on the first inorganic insulating layer, and a second inorganic insulating layer on the second organic insulating layer, and the thin film transistor portion may be disposed directly on the second inorganic insulating layer.

The first conductive layer may be disposed between the second organic insulating layer and the second inorganic insulating layer.

The first conductive layer may be disposed between the first inorganic insulating layer and the second organic insulating layer.

The first conductive layer may be disposed between the first organic insulating layer and the first inorganic insulating layer.

The first conductive layer may be disposed under the first organic insulating layer.

The substrate portion may further include a barrier layer that includes amorphous silicon (a-Si), and the barrier layer may be disposed between at least one of the first organic insulating layer and the first inorganic insulating layer, the first inorganic insulating layer and the second organic insulating layer, or the second organic insulating layer and the second inorganic insulating layer.

At least one of the first or second organic insulating layers, or first or second inorganic insulating layers may be disposed between the first conductive layer and the barrier layer.

The substrate portion may further include a second conductive layer that includes doped amorphous silicon (a-Si).

The second conductive layer may be disposed between at least one of the first organic insulating layer and the first inorganic insulating layer, the first inorganic insulating layer and the second organic insulating layer, or the second organic insulating layer and the second inorganic insulating layer.

At least one of the first and second organic insulating layers, or first and second inorganic insulating layers may be disposed between the first conductive layer and the second conductive layer.

The second conductive layer may be disposed under the first organic insulating layer.

The first conductive layer may be disposed on an entire surface of the substrate portion.

The thin film transistor may include a semiconductor layer, and a gate electrode that at least partially overlaps the semiconductor layer, and the semiconductor layer may be disposed on the at least one inorganic insulating layer to directly contact the at least one inorganic insulating layer.

The substrate portion may be flexible.

The display apparatus may further include a display device disposed on the thin film transistor portion that is electrically connected to the thin film transistor.

According to one or more embodiments, a display apparatus includes: a substrate portion that includes a substrate, at least one inorganic insulating layer disposed on the substrate, and a conductive layer disposed between the substrate and the inorganic insulating layer and that includes doped amorphous silicon (a-Si); and a thin film transistor portion disposed on the substrate portion and that includes a thin film transistor.

The substrate portion may be rigid.

According to one or more embodiments, a display apparatus includes: a substrate portion that includes a first organic insulating layer, a first inorganic insulating layer on the first organic insulating layer, a second organic insulating layer on the first inorganic insulating layer, and a second inorganic insulating layer on the second organic insulating layer, and a first conductive layer that includes doped amorphous silicon (a-Si) and that is disposed between at least one of the first and second organic insulating layers and at least one of the first and second inorganic insulating layers. The first conductive layer is disposed on an entire surface of the substrate portion, and the substrate portion is flexible.

The display apparatus may further include: a thin film transistor portion disposed on the substrate portion and that comprises a thin film transistor; and a display device disposed on the thin film transistor portion that is electrically connected to the thin film transistor. The thin film transistor may include a semiconductor layer and a gate electrode that at least partially overlaps the semiconductor layer, and the semiconductor layer may be directly disposed on the second inorganic insulating layer to directly contact the second inorganic insulating layer.

DETAILED DESCRIPTION

Figure 1:
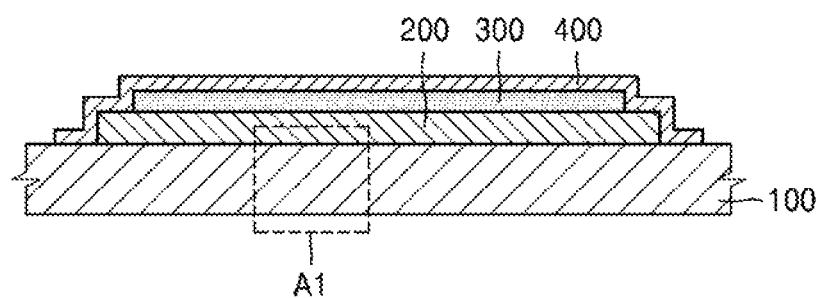
FIG. 1 is a schematic cross-sectional view of a display apparatus according to an embodiment of the present disclosure.

As the present disclosure allows for various changes and numerous embodiments, exemplary embodiments will be illustrated in the drawings and described in detail in the written description. However, the embodiments may have different forms and should not be construed as being limited to the descriptions set forth herein.

Exemplary embodiments will be described below in more detail with reference to the accompanying drawings. Those components that are the same or are in correspondence may have the same reference numeral regardless of the figure number, and redundant explanations are omitted.

It will be understood that when a layer, region, or component is referred to as being "formed on" another layer, region, or component, it can be directly or indirectly formed on the other layer, region, or component. Sizes of components in the drawings may be exaggerated for convenience of explanation.

Figure 2:
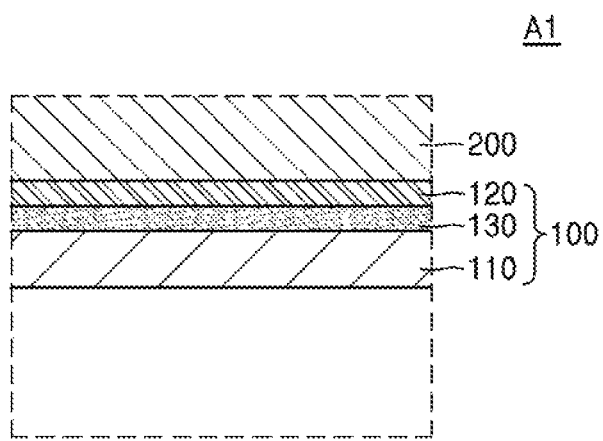
FIG. 2 is a schematic cross-sectional view that shows an enlarged view of a part A1 in the display apparatus of FIG. 1.

FIG. 1 is a schematic cross-sectional view of a display apparatus according to an embodiment, and FIG. 2 is a schematic cross-sectional view that shows an enlarged view of a part A1 in the display apparatus of FIG. 1.

Referring to FIG. 1, a display apparatus according to an embodiment includes a substrate portion 100, a thin film transistor portion 200 disposed on the substrate portion 100, a display device 300 disposed on the thin film transistor portion 200, and an encapsulation portion 400 disposed to seal the display device 300.

In a present embodiment, the substrate portion 100 has a multi-layered structure in which a plurality of layers are stacked. In addition, in a present embodiment, the substrate portion 100 is flexible, and a display apparatus that includes the substrate portion 100 is a flexible display apparatus.

Figure 3:
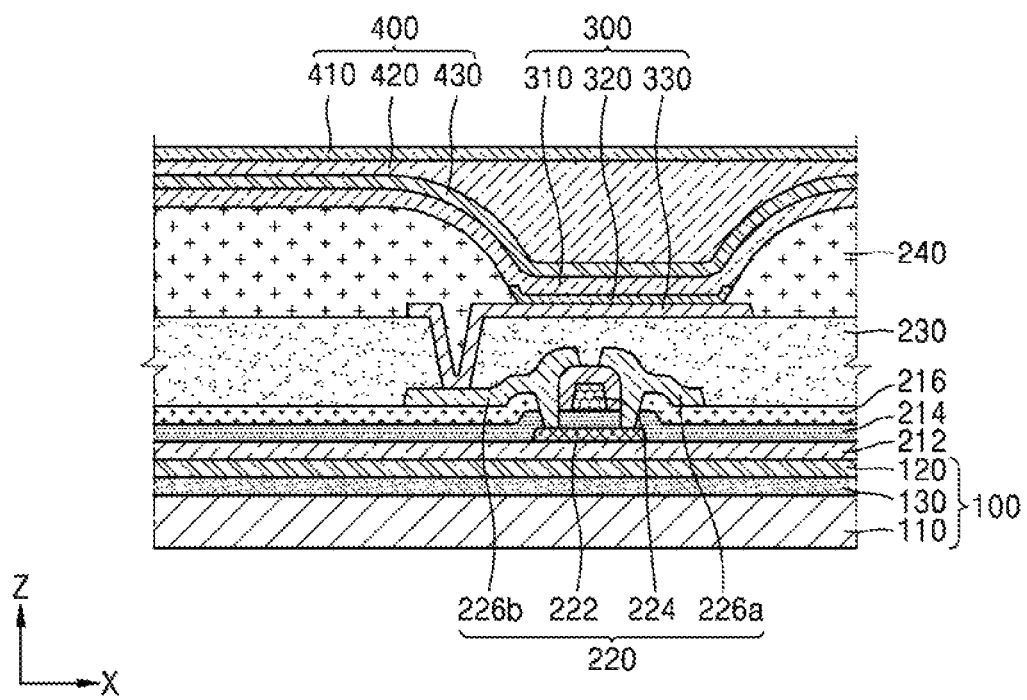
FIG. 3 is a schematic cross-sectional view that shows a portion with a pixel in the display apparatus of FIG. 1.

In a present embodiment, the thin film transistor portion 200 includes a thin film transistor 220, shown in FIG. 3, a capacitor, and various devices for supplying electric power to the display device 300. The display device 300 is disposed on the thin film transistor portion 200. The display device 300 includes a plurality of pixels, and the display device 300 is electrically connected to the thin film transistor 220, In a present embodiment, the display device 300 is an organic light-emitting device, but in other embodiments, the display device may be an inorganic light-emitting device, a liquid crystal device, etc.

In a present embodiment, the encapsulation portion 400 is disposed on the display device 300 and seals the display device 300 against external damage. The encapsulation portion 400 has a multi-layered structure in which organic layers and inorganic layers are alternately stacked, Since an end surface of the encapsulation portion 400 directly contacts an upper surface of the substrate portion 100 or an upper surface of an inorganic layer included in the thin film transistor portion 200, the display device 300 is sealed from the external environment. In a present embodiment, the organic light-emitting device used as the display device 300 emits light by using an organic material, and thus the organic light-emitting device is vulnerable to moisture and impurities. Therefore, when the display device 300 is sealed by using the encapsulation portion 400, the display device 300 is protected against infiltration of external moisture.

In addition, when a flexible display apparatus includes a flexible substrate portion 100, since the substrate portion 100 includes an organic material, static electricity can be transmitted to devices disposed on the substrate portion 100 through the substrate portion 100, and in particular, electric charge is concentrated on a bending portion and components in the bending portion can be damaged when the substrate portion 100 is repeatedly folded/unfolded.

Accordingly, in a display apparatus according to a present embodiment, since the substrate portion 100 includes a first conductive layer 130 that includes amorphous silicon (a-Si), electric charge can be dispersed.

Referring to FIG. 2, the substrate portion 100 of a display apparatus according to an embodiment includes at least one organic insulating layer 110, at least one inorganic insulating layer 120, and the first conductive layer 130 disposed between the organic insulating layer 110 and the inorganic insulating layer 120 that includes amorphous silicon (a-Si).

In a present embodiment, the organic insulating layer 110 includes a plastic material having excellent thermal resistance and excellent durability. For example, the organic insulating layer 110 may include one selected from polyimide (PI), polyethersulfone (PES), polyacrylate (PA), polyetherimide (PEI), polyethyelenen napthalate (PEN), polyethyelene terepthalate (PET), polyphenylene sulfide (PPS), polyarylate (PAR), polycarbonate (PC), cellulosetriacetate, cellulose acetate propionate (CAP), poly(aryleneether sulfone), or a combination thereof.

In a present embodiment, the inorganic insulating layer 120 includes a material such as silicon oxide, silicon nitride, etc. FIG. 2 shows the inorganic insulating layer 120 has having a single-layered structure, but embodiments are not limited thereto, and the inorganic insulating layer 120 may have the singles layered structure or a multi-layered structure in other embodiments. For example, when the inorganic insulating layer 120 has a multi-layered structure, a silicon oxide layer and a silicon nitride layer can be alternately stacked.

As described above, in a present embodiment, the thin film transistor portion 200 is directly disposed on the inorganic insulating layer 120. In addition, a thin film transistor may be disposed directly on the inorganic insulating layer 120, or an inorganic layer such as a buffer layer may be disposed on an upper surface of the inorganic insulating layer 120 and the thin film transistor may be disposed on the buffer layer. A structure of the thin film transistor portion 200 disposed on the inorganic insulating layer 120 will be described below with reference to FIG. 3.

In addition, hi a present embodiment, the first conductive layer 130 is disposed between the organic insulating layer 110 and the inorganic insulating layer 120. The first conductive layer 130 includes amorphous silicon (a-Si), and impurities are doped into the amorphous silicon (a-Si) to provide conductivity. In a present embodiment, the first conductive layer 130 can be doped with an n-type dopant or a p-type dopant. For example, generally-known dopants, such as phosphor (P) as an n-type dopant or boron (B) as a p-type dopant, can be used, and a doping concentration can be, for example, 1E19 Atoms/cm$^3$. In addition, the first conductive layer 130 has a thickness of about 10 Å to about 5000 Å, but embodiments are not limited thereto. The first conductive layer 130 is disposed on an entire surface of the substrate portion 100.

In a display apparatus according to an embodiment, since the first conductive layer 130 includes doped amorphous silicon (a-Si) and is disposed between the organic insulating layer 110 and the inorganic insulating layer 120, electric charge is dispersed and damage to devices caused by static electricity can be prevented. In addition, since the first conductive layer 130 includes doped amorphous silicon (a-Si), additional manufacturing equipment is not needed, as compared with a conductive layer that includes a metal, and thus the efficiency of the manufacturing processes can be improved.

FIG. 3 is a schematic cross-sectional view that shows a portion with a pixel in the display apparatus of FIG. 1.

FIG. 3 schematically shows a cross-section of a pixel or sub-pixel of the display device 300 of the display apparatus 1 according to an embodiment.

A display apparatus according to a present embodiment includes the substrate portion 100, the thin film transistor portion 200 disposed on the substrate portion 100, the display device 300 electrically connected to a thin film transistor 220, and the encapsulation portion 400 that seals the display device 300.

As described above, according to a present embodiment, the substrate portion 100 includes at least one organic insulating layer 110, at least one inorganic insulating layer 120, and the first conductive layer 130 disposed between the organic insulating layer 110 and the inorganic insulating layer 120, in which the first conductive layer 130 includes amorphous silicon (a-Si). In a display apparatus according to an embodiment, since the first conductive layer 130 includes doped amorphous silicon (a-Si) and is disposed between the organic insulating layer 110 and the inorganic insulating layer 120, electric charge is dispersed and damage to devices caused by static electricity can be prevented.

In a present embodiment, the thin film transistor portion 200 includes a thin film transistor 220, a capacitor, etc., and is disposed on the substrate portion 100. The thin film transistor portion 200 includes a plurality of insulating layers, and further includes an inorganic layer such as a buffer layer 212 between the thin film transistor 220 and the substrate portion 100. The thin film transistor 220 includes a semiconductor layer 222 that includes amorphous silicon, polysilicon, or an organic semiconductor material, a gate electrode 224, a source electrode 226a, and a drain electrode 226b.

In a present embodiment, the substrate portion 100 has a structure in which the organic insulating layer 110, the first conductive layer 130, and the inorganic insulating layer 120 are sequentially stacked. The thin film transistor 220 is disposed on the substrate portion 100, and as shown in FIG. 3, the buffer layer 212 is disposed on the inorganic insulating layer 120, and the semiconductor layer 222 is disposed on the buffer layer 212. However, in other embodiments, the semiconductor layer 222 can be directly disposed on the inorganic insulating layer 120 of the substrate portion 100.

In a present embodiment, to provide an insulator between the semiconductor layer 222 and the gate electrode 224, a gate insulating layer 214 is disposed between the semiconductor layer 222 and the gate electrode 224, in which the gate insulating layer 214 includes an inorganic material such as silicon oxide, silicon nitride, or silicon oxynitride. In addition, an interlayer insulating layer 216 is disposed on the gate electrode 224, in which the interlayer insulating layer 216 includes an inorganic material such as silicon oxide, silicon nitride, or silicon oxynitride, and the source electrode 226a and the drain electrode 226b are disposed on the interlayer insulating layer 216. The insulating layers as described above can be formed by a chemical vapor deposition (CVD) or an atomic layer deposition (ALD) method. This can be incorporated into other embodiments and modifications thereof that will be described below.

In a present embodiment, the buffer layer 212 is disposed between the thin film transistor 220 and the substrate portion 100, in which the buffer layer 212 includes an inorganic material such as silicon oxide, silicon nitride, or silicon oxynitride. The buffer layer 212 planarizes the upper surface of the substrate portion 100, and prevents or reduces impurity infiltration from the substrate portion 100 into the semiconductor layer 222 of the thin film transistor 220.

In addition, in a present embodiment, an insulating layer 230 is disposed on the thin film transistor 220 to planarize the upper surface of the thin film transistor 220. For example, as shown in FIG. 3, when the display device 300 is disposed on the thin film transistor 220, the insulating layer 230 planarizes an upper portion of a protective layer that covers the thin film transistor 220, The insulating layer 230 includes an organic material, such as acryl, benzocyclobutene (BCS), hexamethyidisiloxane (HMDSO), etc. In FIG. 3, the insulating layer 230 has a single-layered structure, but embodiments are not limited thereto, and the insulating layer 230 may have various other structures, such as a multi-layered structure.

In a present embodiment, the display device 300 is disposed on the insulating layer 230, and the display device 300 includes a pixel electrode 330, an opposite electrode 330, and an intermediate layer 310 disposed between the pixel electrode 330 and the opposite electrode 310 that has an emission layer. The pixel electrode 330 is electrically connected to one of the source electrode 226a and the drain electrode 226b of the thin film transistor 220 via an opening in the insulating layer 230, as shown in FIG. 3.

In a present embodiment, a pixel-defining layer 240 is disposed on an upper portion of the insulating layer 230. The pixel-defining layer 240 has an opening that corresponds to each sub-pixel, that is, an opening that exposes at least a center portion of the pixel electrode 330, to define pixels. In addition, as illustrated in FIG. 3, the pixel-defining layer 240 increases a distance between an edge of the pixel electrode 330 and the opposite electrode 310 above the pixel electrode 330, to prevent generation of an arc at the edge of the pixel electrode 330. The pixel-defining layer 240 includes an organic material, such as HMDSO, etc.

In a present embodiment, the intermediate layer 320 of the display device 300 includes a low-molecular weight material or a polymer material. When the intermediate layer 320 includes a low-molecular weight material, the intermediate layer 320 includes a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N,N'-diphenyl-benzidine (NPB), and tris-8-hydroxyquinoline aluminum ($Alq_3$). The above layers are formed by a vacuum deposition method.

In a present embodiment, when the intermediate layer 320 includes a polymer material, the intermediate layer 320 includes an HTL and an EML. Here, the HTL includes PEDOT, and the EML includes a poly-phenylenevinylene (PPV)-based or polyfluorene-based polymer material. The intermediate layer 320 above can be formed by a screen printing method, an inkjet printing method, or a laser induced thermal imaging (LITI) method.

However, embodiments of the intermediate layer 320 are not limited to the above examples, and can have various structures. In addition, the intermediate layer 320 may include a layer that is integrally formed throughout the plurality of pixel electrodes 330, or a layer that is patterned to correspond to each of the plurality of pixel electrodes 330.

In a present embodiment, the opposite electrode 310 is disposed on the intermediate layer 320. The opposite electrode 310 is integrally formed with respect to the plurality of display devices 300, to correspond to the plurality of pixel electrodes 330.

In a present embodiment, since the display device 300 can be easily damaged by external moisture or oxygen, the encapsulation portion 400 covers the display device 300 to protect the display device 300. The encapsulation portion 400 is disposed throughout the entire surface of the substrate portion 100, and moreover can extend to edges of the substrate portion 100. The encapsulation portion 400 may include a first inorganic encapsulation layer 430, an organic encapsulation layer 420, and a second inorganic encapsulation layer 410, as shown in FIG. 3.

The first inorganic encapsulation layer 430 covers the opposite electrode 310, and includes silicon oxide, silicon nitride, or silicon oxynitride. If necessary, other layers, such as a capping layer, etc., can be disposed between the first inorganic encapsulation layer 430 and the opposite electrode 310.

In a present embodiment, since the first inorganic encapsulation layer 430 is provided along with a structure thereunder, as shown in FIG. 3, an upper surface of the first inorganic encapsulation layer 430 may not be flat. The organic encapsulation layer 420 covers the first inorganic encapsulation layer 430, but unlike the first inorganic encapsulation layer 430, the organic encapsulation layer 420 has a flat upper surface. The organic encapsulation layer 420 includes one or more materials selected from polyethylene terephthalate, polyethylene naphthalate, polycarbonate, polyimide, polyethylene sulfonate, polyoxymethylene, polyarylate, or hexamethyldisiloxane.

In a present embodiment, the second inorganic encapsulation layer 410 covers the organic encapsulation layer 420, and includes silicon oxide, silicon nitride, or silicon oxynitride. The second inorganic encapsulation layer 410 contacts the first inorganic encapsulation layer 430 at the edges of the substrate portion 100 to avoid externally exposing the organic encapsulation layer 420.

In a present embodiment, as described above, since the encapsulation portion 400 includes the first inorganic encapsulation layer 430, the organic encapsulation layer 420, and the second inorganic encapsulation layer 410, even id cracks occur in the encapsulation portion 400, the cracks may not be continuous between the first inorganic encapsulation layer 430 and the organic encapsulation layer 420 or between the organic encapsulation layer 420 and the second inorganic encapsulation layer 410 due to the multi-layered structure. As such, formation of paths through which external moisture or oxygen can infiltrate into the display portion can be prevented or reduced.

In a present embodiment, a touch sensor layer can be disposed on the encapsulation portion 400, and other functional layers, such as a capping layer, an adhesive layer, etc., may be further disposed between the encapsulation portion 400 and the touch sensor layer. The touch sensor layer can be manufactured as an additional panel on a transparent substrate and laminated to the display apparatus, or may be directly formed as a pattern on the upper portion of the encapsulation layer 400.

Figure 4:
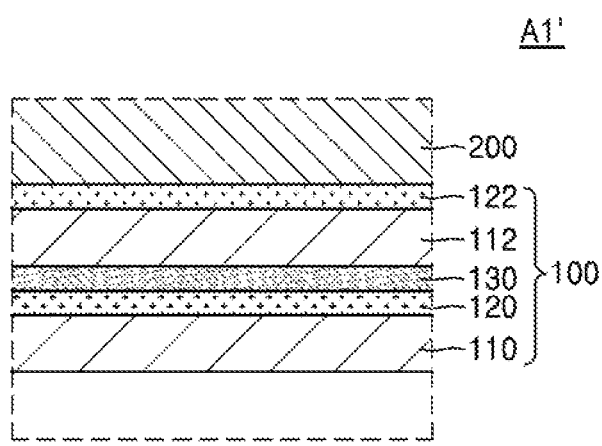
FIGS. 4 to 9 are schematic cross-sectional views of display apparatuses according to embodiments of the present disclosure.
Figure 5:
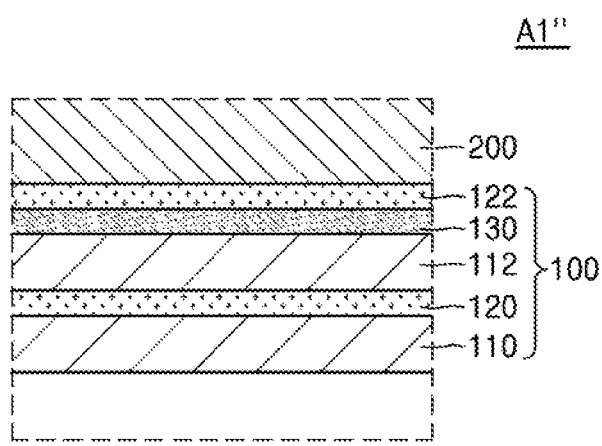

FIG. 4 is a schematic cross-sectional view of a display apparatus according to another embodiment, and FIG. 5 is a schematic cross-sectional view of a display apparatus according to another embodiment.

Referring to FIG. 4, a display apparatus according to a present embodiment includes the substrate portion 100 that includes first and second organic insulating layers 110 and 112, first and second inorganic insulating layers 120 and 122, and the first conductive layer 130 that includes amorphous silicon (a-Si).

Features and materials of the first and second organic insulating layers 110 and 112 and the first and second inorganic insulating layers 120 and 122 are the same as the above descriptions, and detailed descriptions thereof are omitted.

The substrate portion 100 according to a present embodiment includes the first organic insulating layer 110, the first inorganic insulating layer 120 on the first organic insulating layer 110, the second organic insulating layer 112 on the first inorganic insulating layer 120, the second inorganic insulating layer 122 on the second organic insulating layer 112, and the first conductive layer 130 between the first inorganic insulating layer 120 and the second organic insulating layer 112. That is, the substrate portion 100 includes organic insulating layers 110 and 112 and inorganic insulating layers 120 and 122 that are alternately stacked, and the first conductive layer 130 is disposed between at least one organic insulating layer 110 and at least one inorganic insulating layer 120. The first conductive layer 130 includes amorphous silicon (a-Si), and thus improves the contacts between the organic insulating layer 110 and the inorganic insulating layer 120.

In a present embodiment, the first conductive layer 130 is disposed between the first inorganic insulating layer 120 and the second organic insulating layer 112, but embodiments are not limited thereto. The layers between which the first conductive layer 130 is disposed are not restricted, provided that the first conductive layer 130 is disposed between at least one of the organic insulating layers 110 and at least one of the inorganic insulating layers 120. However, in the substrate portion 100 that includes a plurality of insulating layers, when the first conductive layer 130 is adjacent to the thin film transistor portion 200, static electricity generated in the thin film transistor portion 200 can be more effectively dispersed.

Referring to FIG. 5, the substrate portion 100 according to a present embodiment includes organic insulating layers 110 and 112 and inorganic insulating layers 120 and 122 that are alternately stacked, and the first conductive layer 130 is disposed between at least one organic insulating layer 110 and at least one inorganic insulating layer 120. In a present embodiment, the first conductive layer 130 is disposed between the second organic insulating layer 112 and the second inorganic insulating layer 122. As described above, the first conductive layer 130 is disposed between at least one organic insulating layer 110 and at least one inorganic insulating layer 120, and is not necessarily disposed between certain layers. Thus, as shown in FIG. 5, the first conductive layer 130 is disposed between the second organic insulating layer 112 and the second inorganic insulating layer 112 of the substrate portion 100.

Figure 6:
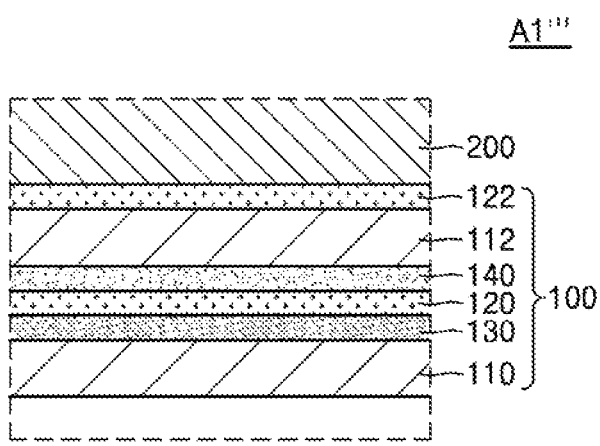
Figure 7:
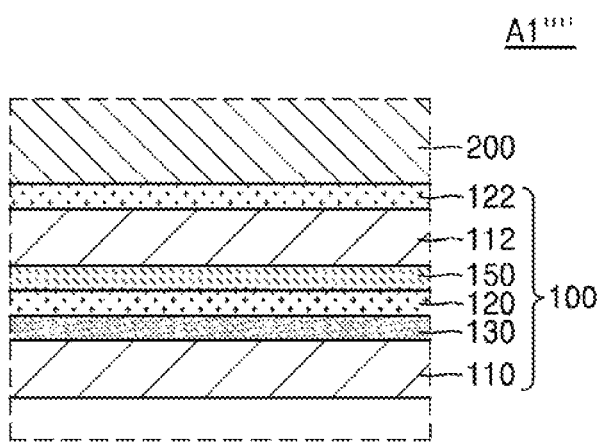

FIG. 6 is a schematic cross-sectional view of a display apparatus according to another embodiment, and FIG. 7 is a schematic cross-sectional view of a display apparatus according to another embodiment.

Referring to FIG. 6, a display apparatus according to a present embodiment includes the substrate portion 100 that includes first and second organic insulating layers 112, first and second inorganic insulating layers 112, the first conductive layer 130 and a second conductive layer 140 that includes amorphous silicon (a-Si).

Features and materials of the first and second organic insulating layers 110 and 112 and the first and second inorganic insulating layers 120 and 122 are the same as the above descriptions, and detailed descriptions thereof are omitted.

In a present embodiment, the substrate portion 100 includes the first organic insulating layer 110, the first inorganic insulating layer 120, the second organic insulating layer 112, the second inorganic insulating layer 122, the first conductive layer 130 disposed between the first organic insulating layer 110 and the first inorganic insulating layer 120, and the second conductive layer 140 disposed between the first inorganic insulating layer 120 and the second organic insulating layer 112. That is, the substrate portion 100 includes organic insulating layers 110 and 112 and inorganic insulating layers 120 and 122 that are alternately stacked, and the first conductive layer 130 and the second conductive layer 140 are respectively disposed between at least one organic insulating layer 110 and at least one inorganic insulating layer 120.

The first conductive layer 130 and the second conductive layer 140 according to a present embodiment include amorphous silicon, and are conductive due to doping impurities in the amorphous silicon (a-Si). The first conductive layer 130 and the second conductive layer 140 may be doped with an n-type dopant or a p-type dopant. For example, generally-known dopants, such as phosphor (P) as an n-type dopant or boron (B) as a p-type dopant, can be used, and a doping concentration is, for example, 1E19 Atoms/cm$^3$. In addition, the first conductive layer 130 and the second conductive layer 140 each have a thickness of about 10 Å to about 5000 Å, but embodiments are not limited thereto. The first conductive layer 130 and the second conductive layer 140 are disposed on an entire surface of the substrate portion 100.

In a present embodiment, the first conductive layer 130 and the second conductive layer 140 include amorphous silicon (a-Si), and thus improve the contacts between the organic insulating layer 110 and the inorganic insulating layer 120. In addition, since the first conductive layer 130 and the second conductive layer 140 are respectively disposed between one organic insulating layer 110 and one inorganic insulating layer 120, electrified charge is dispersed and damage to the device caused by static electricity can be prevented. In addition, the first conductive layer 130 and the second conductive layer 140 can be formed by doping the amorphous silicon (a-Si), and thus, there is no need for additional manufacturing equipment, as compared with a conductive layer that includes a metal, and thus the efficiency of the manufacturing processes can be improved.

Referring to FIG. 7, a display apparatus according to a present embodiment includes substrate portion 100 that includes the first organic insulating layer 110, the second organic insulating layer 112, the first inorganic insulating layer 120, the second inorganic insulating layer 122, a barrier layer 150, and the first conductive layer 130 that includes amorphous silicon (a-Si).

An embodiment illustrated with reference to FIG. 7 differs from an embodiment illustrated in FIG. 6 by including the barrier layer 150 instead of the second conductive layer 140. That is, the second conductive layer 140 of FIG. 6 is formed by doping the amorphous silicon (a-Si) with impurities, while the amorphous silicon (a-Si) in the barrier layer 150 of FIG. 7 is not doped. Therefore, although the second conductive layer 140 of FIG. 6 and the barrier layer 150 of FIG. 7 include the same material, i.e., amorphous silicon (a-Si), the second conductive layer 140 is conductive and the barrier layer 150 is not conductive.

In a present embodiment, since the barrier layer 150 includes amorphous silicon (a-Si), the contact between the organic insulating layer 110 and the inorganic insulating layer 120 is improved. In addition, since the first conductive layer 130 is disposed between one organic insulating layer 110 and one inorganic insulating layer 120, electric charge is dispersed and damage to the device caused by static electricity can be prevented. Furthermore, since the first conductive layer 130 is formed by doping the amorphous silicon (a-Si), there is no need to use additional manufacturing equipment, as compares with a conductive layer that includes a metal, and thus the efficiency of manufacturing processes can be improved.

Figure 8:
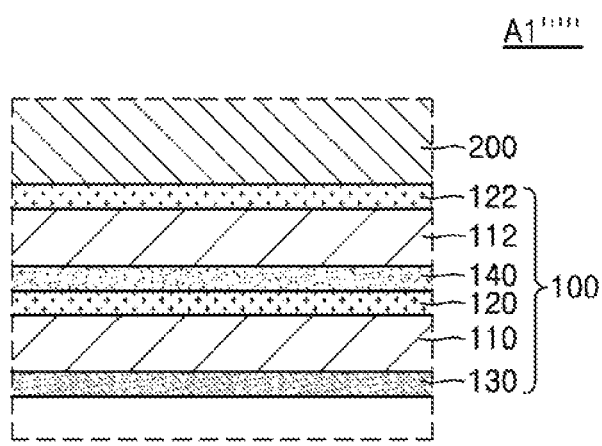
Figure 9:
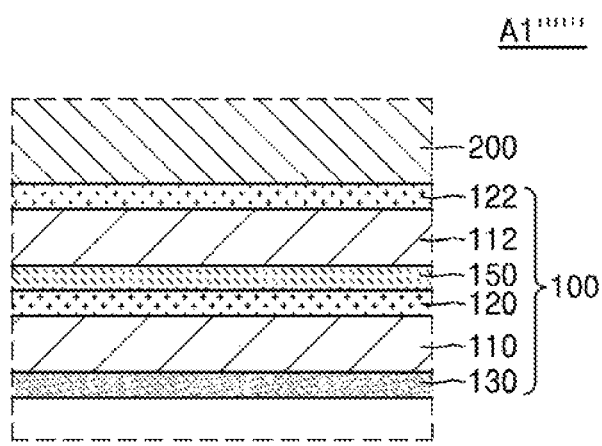

FIG. 8 is a schematic cross-sectional view of a display apparatus according to another embodiment, and FIG. 9 is a schematic cross-sectional view of a display apparatus according to another embodiment.

Referring to FIG. 8, a display apparatus according to a present embodiment includes substrate portion 100 that includes first and second organic insulating layers 110 and 112, first and second inorganic insulating layers 120 and 122, the first conductive layer 130 and a second conductive layer 140 that includes amorphous silicon (a-Si).

Features and materials of the first and second organic insulating layers 110 and 112 and the first and second inorganic insulating layers 120 and 122 are the same as the above descriptions, and detailed descriptions thereof are omitted.

The substrate portion 100 according to an embodiment includes the first organic insulating layer 110, the first inorganic insulating layer 120, the second organic insulating layer 112, the second inorganic insulating layer 122, the first conductive layer 130 disposed under the first organic insulating layer 110, and the second conductive layer 140 disposed between the first inorganic insulating layer 120 and the second organic insulating layer 112.

That is, in the substrate portion 100 according to a present embodiment, the first conductive layer 130 is under the first organic insulating layer 110. Since impurities can be easily introduced into the first organic insulating layer 110 from a lower portion of the first conductive layer 130, the first conductive layer 130 is disposed under the first organic insulating layer 110, which can simultaneously prevent impurity infiltration into the substrate portion 100 as well as static electricity.

Referring to FIG. 9, the substrate portion 100 of a display apparatus according to an embodiment illustrated with reference to FIG. 9 has a structure the first conductive layer 130 to that of the embodiment illustrated in FIG. 8, except that the substrate portion 100 of FIG. 9 has an undoped barrier layer 150 instead of the second conductive layer 140.

That is, in a present embodiment, the substrate portion 100 of a display apparatus according to an embodiment of FIG. 9 includes the first organic insulating layer 110, the first inorganic insulating layer 120, the second organic insulating layer 112, the second inorganic insulating layer 122, the first conductive layer 130 disposed under the first organic insulating layer 110, and the barrier layer 150 disposed between the first inorganic insulating layer 120 and the second organic insulating layer 112.

In a present embodiment, since the barrier layer 150 is disposed under the first organic insulating layer 110, impurity infiltration from the lower portion of the first organic insulating layer 110 into the substrate portion 100 can be prevented, and electric charge can be dispersed via the second conductive layer 140 to prevent defects caused by the static electricity.

In the substrate portion 100 of a display apparatus according to a present embodiment, the organic insulating layers 110 and the inorganic insulating layers 120 are alternately stacked, at least one amorphous silicon layer is disposed between at least one organic insulating layer 110 and at least one inorganic insulating layer 120, and at least one of the amorphous silicon layers is a conductive layer that is doped to be conductive.

Figure 10:
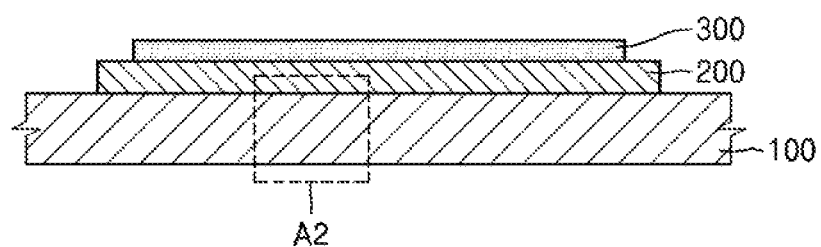
FIG. 10 is a schematic cross-sectional view of a display apparatus according to an embodiment of the present disclosure.
Figure 11:
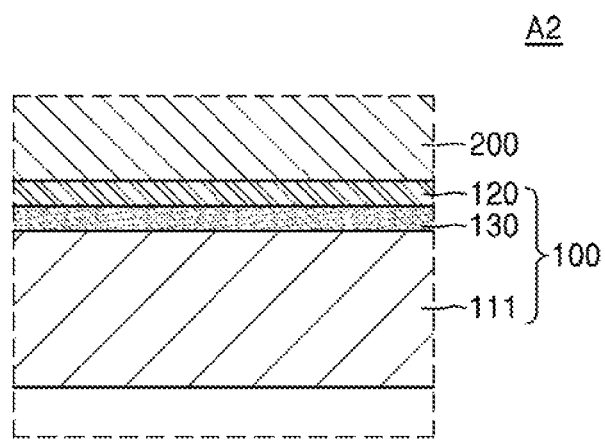
FIG. 11 is a schematic cross-sectional view showing an enlarged view of a part A2 in the display apparatus of FIG. 10.

FIG. 10 is a schematic cross-sectional view of a display apparatus according to another embodiment, and FIG. 11 is a schematic cross-sectional view showing an enlarged view of a part A2 in the display apparatus of FIG. 10.

Referring to FIG. 10, a display apparatus according to a present embodiment includes the substrate portion 100, the thin film transistor portion 200 disposed on the substrate portion 100, and the display device 300 disposed on the thin film transistor portion 200.

In a present embodiment, the substrate portion 100 has a multi-layered structure in which a plurality of layers are stacked. Also, in a present embodiment, the substrate portion 100 is rigid, and accordingly, a display apparatus that includes the substrate portion 100 is a rigid display apparatus. In addition, a display apparatus according to a present embodiment further includes an upper substrate that faces the substrate 100 with the display device 300 interposed between the upper substrate and the substrate portion 100.

In a present embodiment, the thin film transistor portion 200 is disposed on the substrate portion 100. Since the thin film transistor portion 200 has the same structure as those described above, the above descriptions thereof are applied here.

Referring to FIG. 11, a display apparatus according to a present embodiment includes substrate portion 100 that includes a substrate 111, at least one inorganic insulating layer 120 disposed on the substrate 111, and a conductive layer 130 disposed between the substrate 111 and the inorganic insulating layer 120.

In a present embodiment, the substrate 111 is a rigid substrate, and includes, for example, glass, a metal, or plastic. The conductive layer 130 is disposed on the substrate 111, and the inorganic insulating layer 120 is disposed on the conductive layer 130. The inorganic insulating layer 120 may have a single-layered or a multi-layered structure that includes silicon oxide or silicon nitride.

In a present embodiment, the conductive layer 130 according to a present embodiment includes amorphous silicon (a-Si) that is doped. That is, the conductive layer 130 does not include a metal, but instead, acquires conductivity by doping the amorphous silicon (a-Si). The conductive layer 139 that includes doped amorphous silicon (a-Si) as described above disperses the electric charge that would otherwise concentrate at a particular location on the substrate portion 100 to prevent static electricity. In addition, since the conductive layer 130 is formed by doping the amorphous silicon (a-SD), there is no need to use additional manufacturing equipment, as compared with a conductive layer that includes metal, and thus the efficiency of the manufacturing processes can be improved.

Figure 12:
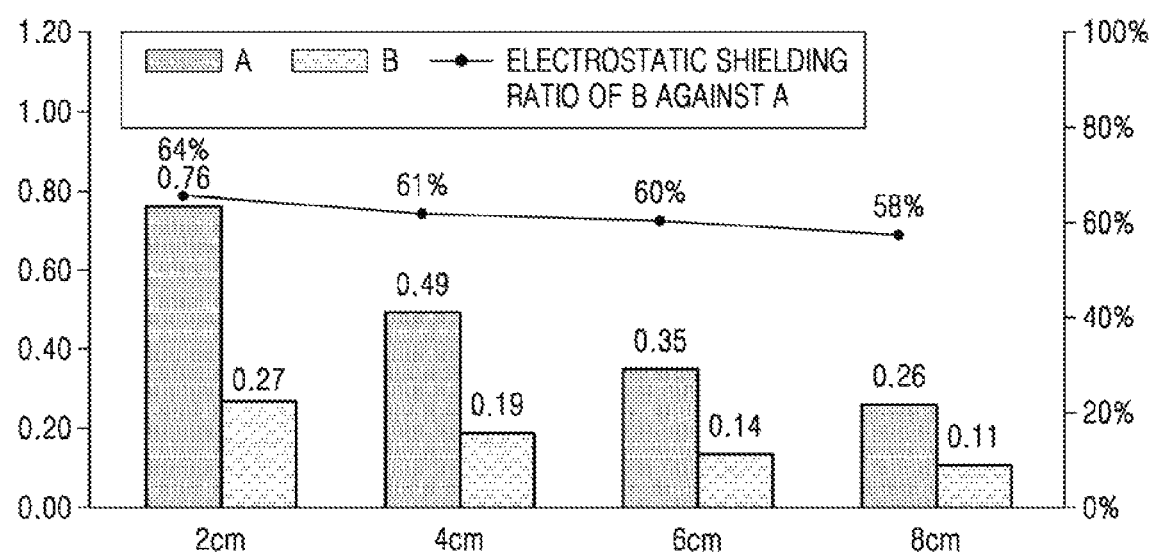
FIG. 12 is a bar graph of result data of static electricity reduction experiments performed on a display apparatus according to an embodiment of the present disclosure.

FIG. 12 is a graph of result data of static electricity reduction experiments performed on a display apparatus according to an embodiment of the present disclosure.

Referring to FIG. 12, A denotes a comparative example of a display apparatus that includes the substrate portion 100 without a conductive layer, and B denotes a display apparatus that includes the substrate portion 100 having a conductive layer according to an embodiment of the present disclosure. In addition, the Y-axis of the graph denotes a static shielding ratio, which is a dimensionless numerical value of static electricity measured from the substrate portion 100. In the vertical axis, "1.00" means that static electricity is not 100% shielded, and "0.00" means that static electricity is 100% shielded. The X-axis of the graph indicates the distance between the substrate and the static electricity generator.

As shown in the graph of FIG. 12, in the case of comparative example A, in which the substrate portion 100 does not include the conductive layer, measured numeral values of the static electricity were 0.76, 0.49, and 0.35, whereas in a case of embodiment B, in which the substrate portion 100 includes the conductive layer, measured numerical values of the static electricity were 0.27, 0.19, and 0.14. Thus, the experiment exhibits that embodiment B exhibits a static electricity blockage ratio of 60% or greater with respect to the comparative example A.

According to an embodiment of the present disclosure, a display apparatus having reduced defects caused by static electricity is provided. However, the scope of the present disclosure is not limited to the above effects.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus, comprising:
   a substrate unit that comprises a first organic insulating layer, a first inorganic insulating layer on the first organic insulating layer, a second organic insulating layer on the first inorganic insulating layer, a second inorganic insulating layer on the second organic insulating layer, a first conductive layer that includes amorphous silicon (a-Si) and that is disposed between at least one of the first and second organic insulating layers and at least one of the first and second inorganic insulating layers, and a barrier layer that includes amorphous silicon (a-Si); and
   a thin film transistor unit disposed on the substrate unit and that comprises a thin film transistor.

2. The display apparatus of claim 1, wherein the first conductive layer is doped with an n-type dopant or a p-type dopant.

3. The display apparatus of claim 1, wherein the first conductive layer is doped, and the thin film transistor unit is disposed directly on the second inorganic insulating layer.

4. The display apparatus of claim 1, wherein the first conductive layer is disposed between the first inorganic insulating layer and the second organic insulating layer.

5. The display apparatus of claim 1, wherein the barrier layer is disposed between at least one of the first organic insulating layer and the first inorganic insulating layer, the first inorganic insulating layer and the second organic insulating layer, or the second organic insulating layer and the second inorganic insulating layer.

6. The display apparatus of claim 5, wherein at least one the first or second organic insulating layers, or first or second inorganic insulating layers is disposed between the first conductive layer and the barrier layer.

7. The display apparatus of claim 1, wherein the first conductive layer is disposed on an entire surface of the substrate unit.

8. The display apparatus of claim 1, wherein the thin film transistor comprises a semiconductor layer, and a gate electrode that at least partially overlaps the semiconductor layer, and the semiconductor layer is disposed on the at least one inorganic insulating layer to directly contact the at least one inorganic insulating layer.

9. The display apparatus of claim 1, wherein the substrate unit is flexible.

10. The display apparatus of claim 1, further comprising a display device disposed on the thin film transistor unit that is electrically connected to the thin film transistor.

11. A display apparatus, comprising:
    a substrate unit that comprises a first organic insulating layer, a first inorganic insulating layer on the first organic insulating layer, a second organic insulating layer on the first inorganic insulating layer, and a second inorganic insulating layer on the second organic insulating layer, a first conductive layer that includes amorphous silicon (a-Si) and that is disposed between at least one of the first and second organic insulating layers and at least one of the first and second inorganic insulating layers; and
    a thin film transistor unit disposed on the substrate unit and that comprises a thin film transistor;
    wherein the first conductive layer is disposed between the second organic insulating layer and the second inorganic insulating layer.

12. A display apparatus, comprising:
    a substrate unit that comprises a first organic insulating layer, a first inorganic insulating layer on the first organic insulating layer, a second organic insulating layer on the first inorganic insulating layer, and a second inorganic insulating layer on the second organic insulating layer, a first conductive layer that includes amorphous silicon (a-Si) and that is disposed between at least one of the first and second organic insulating layers and at least one of the first and second inorganic insulating layers; and
    a thin film transistor unit disposed on the substrate unit and that comprises a thin film transistor;
    wherein the first conductive layer is disposed between the first organic insulating layer and the first inorganic insulating layer.

13. A display apparatus, comprising:
    a substrate unit that comprises a first organic insulating layer, a first inorganic insulating layer on the first organic insulating layer, a second organic insulating layer on the first inorganic insulating layer, and a second inorganic insulating layer on the second organic insulating layer, a first conductive layer that includes amorphous silicon (a-Si) and that is disposed between at least one of the first and second organic insulating layers and at least one of the first and second inorganic insulating layers; and
    a thin film transistor unit disposed on the substrate unit and that comprises a thin film transistor;
    wherein the first conductive layer is disposed under the first organic insulating layer.

14. A display apparatus, comprising:
    a substrate unit that comprises a first organic insulating layer, a first inorganic insulating layer on the first organic insulating layer, a second organic insulating layer on the first inorganic insulating layer, and a second inorganic insulating layer on the second organic insulating layer, a first conductive layer that includes amorphous silicon (a-Si) and that is disposed between at least one of the first and second organic insulating layers and at least one of the first and second inorganic insulating layers; and
    a thin film transistor unit disposed on the substrate unit and that comprises a thin film transistor;
    wherein the substrate unit further comprises a second conductive layer that includes doped amorphous silicon (a-Si).

15. The display apparatus of claim 14, wherein the second conductive layer is disposed between at least one of the first organic insulating layer and the first inorganic insulating layer, the first inorganic insulating layer and the second organic insulating layer, or the second organic insulating layer and the second inorganic insulating layer.

16. The display apparatus of claim 14, wherein at least one of the first or second organic insulating layers, or first or second inorganic insulating layers is disposed between the first conductive layer and the second conductive layer.

17. The display apparatus of claim 14, wherein the second conductive layer is disposed under the first organic insulating layer.

18. The display apparatus of claim 14, wherein the second conductive layer is doped with an n-type dopant or a p-type dopant.

19. A display apparatus comprising:
    a substrate unit that includes a first organic insulating layer, a first inorganic insulating layer on the first organic insulating layer, a second organic insulating layer on the first inorganic insulating layer, and a second inorganic insulating layer on the second organic insulating layer, a first conductive layer that includes doped amorphous silicon (a-Si) and that is disposed between at least one of the first and second organic insulating layers and at least one of the first and second inorganic insulating layers, and a second conductive layer that includes doped amorphous silicon (a-Si), wherein the first conductive layer is disposed on an entire surface of the substrate unit, and the substrate unit is flexible.

20. The display apparatus of claim 19, further comprising:

a thin film transistor unit disposed on the substrate unit and that comprises a thin film transistor, and a display device disposed on the thin film transistor unit that is electrically connected to the thin film transistor, wherein the thin film transistor comprises a semiconductor layer and a gate electrode that at least partially overlaps the semiconductor layer, and the semiconductor layer is directly disposed on the second inorganic insulating layer to directly contact the second inorganic insulating layer.

21. A display apparatus, comprising:

a substrate unit that comprises a first organic insulating layer, a first inorganic insulating layer on the first organic insulating layer, a second organic insulating layer on the first inorganic insulating layer, a second inorganic insulating layer on the second organic insulating layer, and a first conductive layer including amorphous silicon (a-Si) and disposed under the first organic insulating layer; and a thin film transistor unit disposed on the substrate unit and that comprises a thin film transistor, wherein the first conductive layer is disposed between the first organic insulating layer and the first inorganic insulating layer, and directly contact with the first organic insulating layer and first inorganic insulating layer.

* * * * *